(12) United States Patent
Thompson et al.

(10) Patent No.: US 10,151,032 B2
(45) Date of Patent: *Dec. 11, 2018

(54) PROTECTIVE COVERS

(71) Applicant: Cocoon, Inc., North Hampton, NH (US)

(72) Inventors: Donald B. Thompson, Raleigh, NC (US); Leon S. Moser, Raleigh, NC (US); Katherine A. McNamara, West Newbury, MA (US); Leo J. Crotty, New Castle, NH (US); Alan Smithies, Overland Park, KS (US)

(73) Assignee: Cocoon, Inc., Hampton, NH (US)

( * ) Notice: Subject to any disclaimer, the term of this patent is extended or adjusted under 35 U.S.C. 154(b) by 137 days.

This patent is subject to a terminal disclaimer.

(21) Appl. No.: 14/596,504

(22) Filed: Jan. 14, 2015

(65) Prior Publication Data

US 2016/0244880 A1    Aug. 25, 2016

Related U.S. Application Data

(63) Continuation of application No. 13/722,010, filed on Dec. 20, 2012, now Pat. No. 9,204,525, which is a
(Continued)

(51) Int. Cl.
*A41D 1/00* (2018.01)
*C23C 16/511* (2006.01)
(Continued)

(52) U.S. Cl.
CPC ............ *C23C 16/511* (2013.01); *B32B 5/022* (2013.01); *B32B 5/024* (2013.01); *B32B 5/026* (2013.01);
(Continued)

(58) Field of Classification Search
USPC ............... 442/136, 138, 139, 110, 255, 261; 361/212; 428/195.1, 196, 197, 315.5;
(Continued)

(56) References Cited

U.S. PATENT DOCUMENTS 3,375,120 A * 3/1968 Remer .................. C09D 11/02
106/268
5,071,699 A * 12/1991 Pappas ................. B65D 88/165
383/108

(Continued)

*Primary Examiner* — Lynda Salvatore

(57) ABSTRACT

A multi-layer fabric used to fabricate a garment or a protective cover includes a top and bottom textile layer and an air permeable, moisture-vapor-transmissive, expanded polytetrafluoroethylene middle layer. The fabric exhibits an MVTR rating of at least 4000 g/m$^2$/day. The fabric may also include a top layer coating or fiber treatment of a nano-ceramic material designed to increase the durability of the garment/cover and increase the resistance to abrasion and wear while also resisting environmental conditions including exposure to solar radiation, temperature and humidity. Alternatively, the upper layer of the multi-layer fabric may incorporate ceramic coated fibers or ceramic co-extruded fibers, or carbon nanotubes while in another embodiment may also feature a fire resistant application as well as a permanent, highly breathable and highly durable electrostatic discharge feature added to the inside of the layer by laying down a carbon based printed pattern on the inside of the layer.

18 Claims, 4 Drawing Sheets

Related U.S. Application Data continuation-in-part of application No. 11/482,105, filed on Jul. 7, 2006, now Pat. No. 9,504,860.

(60) Provisional application No. 61/578,446, filed on Dec. 21, 2011.

(51) Int. Cl.

| | |
|---|---|
| *H05F 3/00* | (2006.01) |
| *B32B 5/02* | (2006.01) |
| *B32B 5/30* | (2006.01) |
| *B32B 27/12* | (2006.01) |
| *B32B 27/32* | (2006.01) |
| *B32B 27/34* | (2006.01) |

(52) U.S. Cl.
CPC ............... *B32B 5/30* (2013.01); *B32B 27/12* (2013.01); *B32B 27/322* (2013.01); *B32B 27/34* (2013.01); *H05F 3/00* (2013.01); *B32B 2255/02* (2013.01); *B32B 2255/10* (2013.01); *B32B 2255/26* (2013.01); *B32B 2262/0261* (2013.01); *B32B 2262/0276* (2013.01); *B32B 2264/0257* (2013.01); *B32B 2307/3065* (2013.01); *B32B 2307/554* (2013.01); *B32B 2307/584* (2013.01); *B32B 2307/71* (2013.01); *B32B 2307/714* (2013.01); *B32B 2307/724* (2013.01); *B32B 2307/73* (2013.01); *B32B 2457/00* (2013.01); *B32B 2571/00* (2013.01); *B32B 2605/00* (2013.01)

(58) Field of Classification Search
USPC .................................................................. 2/69
See application file for complete search history.

(56) References Cited

U.S. PATENT DOCUMENTS

| | | | | |
|---|---|---|---|---|
| 5,985,773 | A * | 11/1999 | Lee | ............... D06N 3/14 442/131 |
| 2004/0116022 | A1 * | 6/2004 | Langley | ............... A41D 31/02 442/289 |

* cited by examiner

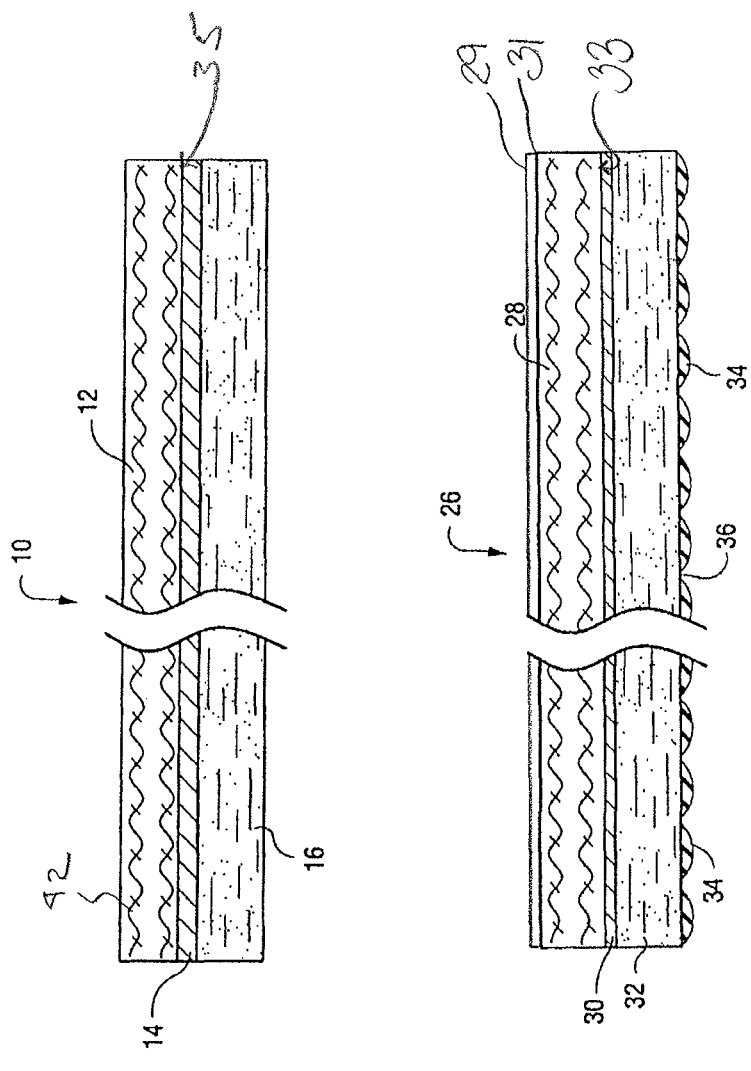

PROTECTIVE COVERS

CROSS-REFERENCE TO RELATED APPLICATIONS

This application is a continuation of U.S. patent application Ser. No. 13/722,010, now U.S. Pat. No. 9,204,525 filed Dec. 20, 2012 and entitled "Protective Covers" which in turn claims priority from U.S. Provisional Application Ser. No. 61/578,446 titled "Protected Covers And Related Fabrics" which was filed on Dec. 21, 2011, and is a continuation-in-part of U.S. patent application Ser. No. 11/482,105, now U.S. Pat. No. 9,504,860 filed on Jul. 7, 2006 and entitled "Protective Covers And Related Fabrics", all of which are incorporated herein fully by reference.

TECHNICAL FIELD

The present invention relates to enhanced properties for fabrics used to make garments or protective covers for equipment typically stored outdoors such as airplanes, vehicles, munitions, weapons and weapons systems, electrical equipment and the like, and more particularly, to the construction of fabrics for such garments and protective covers.

BACKGROUND INFORMATION

Protective covers are often used to protect equipment and parts in a wide range of environmental conditions. Corrosion and oxidation are of particular concern, especially in connection with vehicles, airplanes, munitions, weapons and weapons systems and equipment with metal and/or electronic components and the like.

Prior protective covers that address the problem of corrosion are described in U.S. Pat. Nos. 6,833,334, 6,794,317 and 6,444,595. Many of these covers have been found to have fundamental weaknesses that can create a microclimate underneath the cover when in use. The covers have been found to be generally impermeable to or provide good resistance to rain, snow, and offer good water repellency. They generally use a monolithic impermeable coating on one side of the outer fabric layer to provide water resistance.

In recognition of the microclimates formed underneath the cover, as a humid environment cools and condensation forms on the protected equipment, some of the covers utilize a center layer made of super absorbent fibers (typically made from super absorbent polymer—SAP). When the SAP absorbs the condensation it can make the cover extremely heavy when wet and then can freeze in place in a cold environment. The technology also sometimes uses vapor corrosion inhibitors (VCI's that leach out of the cover as moisture passes through the cover and can deposit itself on the equipment leaving a moist residue on the equipment it is trying to protect.

Additionally, current technologies use UV stabilizers in the dyes used to color the cover fabrics and although this offers some level of durability, the cover life is still generally in the range of 9-18 months of effective working life.

There remains a need, however, for more effective covers that provide protection and resistance to penetration of water, wind and sand and that are especially effective with respect to the prevention or at least minimization of oxidation and/or corrosion due to humidity build-up around the covered objects. Additionally, prior art protective covers have been found to be damaged by abrasion and other environmental factors caused by windblown sand, other wind borne particles and UV solar light and therefore, the ideal protective cover should be durable and able to resist abrasion and damage caused by wind, sand and other substances, as well as resist degradation caused by UV energy from the sun.

It is desirable that covers perform in use without degradation or fall-off in performance for an extended period of time, preferably greater than 4+ years. The primary mode of failure of most covers found in use today is a loss in mechanical strength that can be observed in the formation of holes and tearing of the fabric. This loss in strength and durability is the result of molecular weight loss of the base polymer from which the fabric is made via continued exposure to ultra-violet light.

Protective covers of the type described above are designed and engineered to protect key assets both military and industrial that are subject to corrosion and or degradation from exposure to environmental conditions such as rain, fog, snow, wind, relative humidity, ultraviolet light and general pollution such as air borne dust, sand, acid rain etc. Such assets could be military hardware, such as helicopters and armored vehicles, or electronic components such as generators or general ordnance (small to large scale guns). Overall, cover technology by means of air permeable fabrics are proven to offer suitable protection to the assets described.

In addition, occasionally applications occur where a cover is needed to protect and cover explosive materials and or sensitive electronic equipment. Usually materials used to manufacture covers use insulative, synthetic materials, such as polyester or nylon or similar textile woven or knitted fabrics. The risk of a static electrical charge build up occurring via the on-off motion from the described material cover or a charge build up from in-use dynamic movement and flexing of the cover could cause catastrophic failure of the cover and the asset being protected.

Previously some concepts used to impart electrical conductivity or static dissipation properties to cover materials have been tried and evaluated. Most include the use of yarns or threads containing a percentage component of either a metallic (stainless steel or copper sulphate) or carbon to render the yarn and thus the woven or knitted fabric made from the yarn, electrically conductive. Fabrics have been made where the conductive fabric uses 100% electrically conductive yarns or the electrically conductive yarns can be strategically woven or knitted in to the fabric by use of a grid/square pattern or uni-directional design. In each case the conductive yarns which are always present on either outer surface of the cover can be exposed to the environments described herein which in turn leads to the risk of long term durability failure based upon UV exposure and abrasion damage. Further, the cost of imparting such yarns in the finished fabric can be expensive and cost prohibitive.

In many such cover applications described above it is also necessary to provide fire resistance characteristics to the protective covers due to the explosive materials that require protection. This Fire Resistance feature must be provided without impacting the covers air permeability and Moisture Vapor Transmission Rating (MVTR) characteristics, adding weight or impacting Electro-static discharge.

There are many other situations where a fabric having the characteristics described above would be useful in constructing a garment or the like. For example, in the case of industrial personal protective equipment/clothing; emergency response clothing; military soldier gear and clothing; clothing for those handling munitions; medical clothing and medical related fabrics; wet weather gear; bivouac bags; chemically active textile suits; and tent and shelter fabrics and systems.

Therefore, what is needed is a fabric with a multi-layer construction that uses an outer fabric that is designed to be durable, water-repellant, conforming, and flexible to be shaped and formed to protect the equipment against corrosion and/or oxidation degradation and potential catastrophic failure caused by its exposure to a wide range of environmental conditions. The fabric should provide greater than 2 times the current life of a cover and meet the industry requirements of greater than 4+ years of life. Additionally, the fabric should address the problem of corrosion by providing a level of relative humidity (RH) management and control while also providing an effective and durable electrical conductive or electro-static dissipative (ESD) performance characteristics to the item or material made from the fabric. A preferred fabric and item made therefrom should also include Fire Resistance characteristics.

It is important to note that the present invention is not intended to be limited to a system or method which must satisfy one or more of any stated objects or features of the invention. It is also important to note that the present invention is not limited to the preferred, exemplary, or primary embodiment(s) described herein. Modifications and substitutions by one of ordinary skill in the art are considered to be within the scope of the present invention.

SUMMARY

In accordance with an exemplary embodiment of this invention, the present invention includes a hydrophobic but air-permeable middle layer which prevents build-up of a micro-climate and stabilizes the pressure under the fabric, while still providing the desired water resistance performance needed. An air permeable protective cover or garment is provided that is designed to prevent the ingress of moisture but, at the same time, to allow moisture vapor underneath the cover or garment to readily pass through to the outer environment, thereby preventing humidity buildup and thus helping to prevent or at least minimize oxidation, condensation and/or corrosion of the covered object caused by condensation of any moisture trapped in the air under the cover or garment.

In the underlying technology, the garment or cover is composed of several laminated layers of different materials. The multiple layers include at least an outer textile layer, an intermediate film or membrane of ePTFE or other similar hydrophobic material having good air permeability and moisture-vapor-transmission properties, and an inner textile layer that faces toward the object being covered. For specific applications, the ePTFE membrane may be an air permeable, breathable, treated membrane such as an eVENT® membrane available from BHA Technologies. An optional fourth fabric layer between the outer layer and the film or membrane may incorporate Super Absorbing Polymers (SAPs) to prevent reabsorption of moisture back through the garment or cover.

Corrosion or other inhibitors, such as an anti-microbial to inhibit mold, may also be included in either the textile layers or the membrane itself. All of the various embodiments preferably take advantage of moisture-wicking materials as the laminate layers to help remove moisture vapor from the covered equipment or the area under the garment. The various layers or laminations are held together by adhesive or any other acceptable method in order to achieve the required durability of the final product.

The protective garments or covers described herein preferably have a Moisture Vapor Transmission Rating (MVTR) of at least 4000 $g/m^2/day$ or more and an Air Permeability rating of 0.15 CFM, and wherein the multi-layer fabric system when assembled together or independently, can maintain a relative humidity transmittance rate through the structure at or greater than 0.20%/minute/cu.ft. or 0.05 grains of moisture/minute/cu.ft.

In all cases, the inner textile layer may have material such as silicone dots applied to the inner face thereof, so that contact between the cover and the object to be protected is minimized if not eliminated, and to thereby enhance the moisture vapor transmission away from the person or object.

Textiles suitable for the outer layer include woven, knit and non-woven fabrics such as nylon plain weave and ripstop-fabrics, warp knit fabrics, woven Cordura® (a registered trademark of Invista) fabric, Nomex® and Kevlar® (both registered trademarks of Dupont) fabrics, including blends Taslan fabrics (70-160D) and equivalents.

Textiles suitable for the inner layer include woven, knit and non-woven fabrics such as lightweight warp or circular knit fabrics using nylon, polyester, Nomex® and equivalent fabrics, spunbond nylon and equivalents.

Accordingly, in one aspect, the invention relates to a protective garment or covering comprising a textile layer and an air permeable, moisture-vapor-transmissive, expanded polytetrafluoroethylene membrane layer attached to the textile layer, the cover having an MVTR of at least 4000 $g/m^2/day$.

In another aspect, the invention relates to a fabric for use in garments and protective covers, the fabric comprising at least three layers including an outer woven, knit or non-woven fabric layer and an inner woven, knit or non-woven fabric layer, and a moisture-vapor transmissive, air permeable and oleophobic expanded polytetrafluoroethylene membrane layer between the outer and inner layers; the fabric having an MVTR of at least 4000 $g/m^2/day$.

In the preferred embodiment of the present invention, the protective garment or cover features an additional protection. The enhancement provides new levels of durability (resistance to abrasion and wear) as well as new levels of resistance to environmental conditions including exposure to solar radiation, temperature and humidity. The invention involves treatments to fibers, yarns and/or fabrics that provide a higher surface wear, and greatly improved durability to sunlight exposures.

In a first embodiment, a top coating of ceramic based material, a curable coating including metal or metal oxide pigments, fire resistant components and/or UV absorbing components is applied to the outermost layer. In another embodiment, the threads of the outer layer fabric may be individually treated with such a protective coating, while in yet another embodiment, if the threads of the fabric are extruded, a co-extruded protective coating may be applied directly to the threads. In yet another embodiment, carbon nanotube fibers may be utilized as or incorporated into (along with other fibers or threads) the outer layer. Each additional protection layer is designed to increase the durability of the material made from the disclosed fabric and protect the material from damage caused by wind, sand, and other debris as well as protect from solar degradation caused by UV light.

In another embodiment, a permanent, highly breathable and highly durable electo-static discharge feature is added to the fabric by laying down a carbon based printed pattern on the inside of the laminate, providing a discharge rate of 0.5 sec or greater (5000 volt) on the top and bottom of the laminate without the potential degradation from UV or abrasion.

In another embodiment, a permanent and highly breathable FR feature is added to the fabric by utilizing a gas plasma treatment process to bond FR compound to fibers to achieve flame times of less than 2.0 sec and char lengths of less than 2 inches (FED STD 191 test methods 5903).

In one embodiment, the disclosed fabric may be utilized to construct industrial personal protective equipment/clothing with or without ESD protection. Petrochemical applications for the fabric of the present invention include both outer shells and station ware. Outer shells are the heavy insulated long coat that is worn while actively performing tasks in harsh weather (off shore oil rigs for example) while station ware includes the layers worn under the outer shell and is worn when performing interior tasks. The presently disclosed fabric provides electric arc (ESD) protective gear for both outer shells and station ware.

In another embodiment, the fabric of the present invention may be used to fabricate emergency response clothing such as, but not limited to, firefighting clothing (multiple layers) and turnout gear. Turn out gear is the Outer ware/heavy exterior long "fire coat" that is worn while actively fighting a fire. The fabric may also be used in the construction of technical rescue gear and clothing, specify rescue gear which is intended to include outer wear (coats and pants) that are typically fire resistant, static resistant, highly breathable, and liquid resistant (body fluids).

In yet another embodiment, the fabric of the present invention may be utilized to provide Emergency Medical services gear and clothing as well as military soldier gear and clothing including uniforms, combat shirts and trousers; flight suits and flight uniforms, as well as military and nonmilitary refueling gear including exterior coats and pants worn by maintenance crews when refueling and aircraft and munitions handling and assembly gear and clothing including outer shells, coats and pants worn when handling munitions (to assure that they will be no static discharge and to provide fire resistant clothing).

The present fabric may also be utilized in the manufacture of wet weather gear; Bivouac bags (sleeping system); Chemically Active Textile Suits and related applications; Tent and shelter fabrics/systems; Medical clothing and related products including lab coats, uniforms, and trauma suits; as well as Mattress fabrics/components/covers.

BRIEF DESCRIPTION OF THE DRAWINGS

These and other features and advantages of the present invention will be better understood by reading the following detailed description, taken together with the drawings wherein:

FIG. 3 is a cross section similar to FIG. 3 but with a plurality of spacers applied to the exposed face of the inner layer;

FIG. 4 is a partial perspective view of a composite fabric for making a protective garment/cover in accordance with another embodiment of the present invention in which the outermost layer is constructed of treated fibers or yarns;

DETAILED DESCRIPTION OF THE PREFERRED EMBODIMENTS

Figure 1:
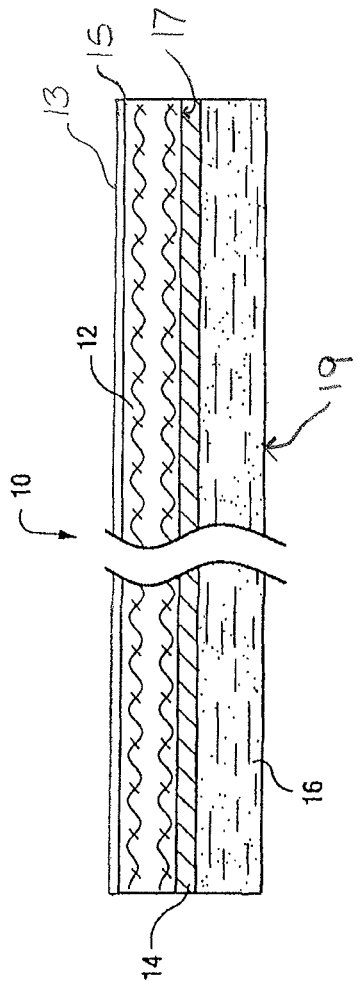
FIG. 1 is a cross section through a laminated protective garment/cover in accordance with an exemplary embodiment of the invention.

Referring to FIG. 1, a protective fabric according to the present invention useful for fabricating a garment, cover or other similar textile item 10 is composed of laminated layers of different materials. The fabric can comprise a sheet of predetermined length and form and used to cover the intended object, such as might be done with a tarp or to make a garment or other textile item or object. Although the present invention may be explained below in connection with a protective cover, it is understood that this is not a limitation of the present invention but rather, is one embodiment or use for the fabric according to the inventive concept. The properties of the fabric described in connection with the cover applies equally in all other uses for the fabric. In addition, the laminated material forming the protective cover may be cut and sewn to fit more precisely a specific object or item of equipment. The seams of this cut and sewn cover may also have seams that are taped or otherwise covered with a compatible material or are welded, in either case so that the finished cover is durably waterproof.

In the exemplary embodiment, at least three laminated layers are employed. These layers include an outer textile fabric or face layer 12; an interior intermediate layer 14; and an inner textile layer 16. The outer textile layer 12 may be composed of suitable woven or non-woven textiles. For example, the outer layer 12 may comprise a high tenacity nylon 6,6 ripstop face fabric available from Precision Fabrics Group, Inc. of Greensboro, N.C. This fabric is of 0.003-0.004 in. thickness with 120 warp ends and 120 filling picks, with an air permeability of 80-120 cfm/sq.ft and a weight of 1.1-1.3 oz/yd$^2$. Suitable Nylon 6,6 ripstock face fabric is also available from Mitsui Textiles of Japan. Another suitable material for the outer textile fabric layer 12 is a 160 Denier Cordura® woven fabric such as Milliken Style 900496-4. The fabric has a weight of 4.5 oz./sq. yd. and is available from Millken Fabrics of Spartanburg, sc. Other suitable textiles include nylon Taslan 70 Denier fabrics, and high modulus woven polyester fabrics available from various suppliers. The outer fabric layer 12 may be appropriately treated to be durably water-resistant. Available treatments include, for example, a Teflon® finish from Dupont or other similar finish from Invista or other known suppliers. The treatments bond to the individual fibers and do not form a continuous coating, maintaining breathability of the overall fabric and cover.

An interior intermediate layer 14 is provided in the form of a hydrophobic film or membrane with good air permeability and moisture-vapor-transmission properties. In the exemplary embodiment, layer 14 is an expanded polytetrafluoroethylene (ePTFE) layer. The expansion of polytetrafluoroethylene opens billions of microscopic pores in the resulting film or membrane 14 to enhance air permeability and water vapor transmission rate.

The ePTFE layer or membrane is also preferably treated to render it permanently oleophobic, waterproof and hydrophobic. A treated membrane of this type is commercially available from BRA Technologies under the trade name eVENT® Fabric. The oleophobic property of this membrane is particularly beneficial in that equipment, particularly military equipment, is often sprayed with oil to minimize corrosion. The ePTFE membrane so treated is rendered resistant to hydraulic fluid, diesel fuel, weapon lubricants and similar field chemicals. Instead of coating the membrane with polyurathene, eVent fabrics are treated with a patented hydrophobic polymer to achieve oleophobic properties. eVent fabric's oleophobic polymer is applied by means of a supercritical gas treatment, eliminating the use of solvents during the production process. This new technology enables both the gas and polymer to completely penetrate the pores of the eVent fabric's membrane, encapsulating each and every fibril during treatment but maintaining open the pores in the fabric thus maintain air permeability.

The unique value that eVENT® or similar fabric with similar properties offers is its ability to eliminate moisture condensation on the article covered while providing a completely waterproof protection (resists liquid water penetration at pressure as high as 10 meters of hydrostatic head). Moisture condenses on the surfaces of the equipment being covered if the protective cover cannot "breathe". This happens due to environmental temperature swings during the storage.

For example, if an object is covered with a nonbreathable protective cover and the environmental conditions are 25° C. temperature and 50% relative humidity, then a drop of ambient temperature by 12° C. would drive the relative humidity inside to over 100% and hence lead to condensation. Utilizing an eVENT® type membrane would keep the relative humidity inside equilibrated to the ambient conditions by allowing the moisture vapors under the fabric to escape out.

Moisture or condensation is the primary cause of the corrosion or moisture damage, including mold, which occurs to items contained under the cover as the climate outside the cover changes. In a preferred embodiment, the cover allows for sufficient air permeability thereby allowing the humidity and pressure changes caused by changed in environmental conditions to stabilize so the risk of condensation forming under the cover and on the equipment or asset being protected is minimized.

Figure 6:
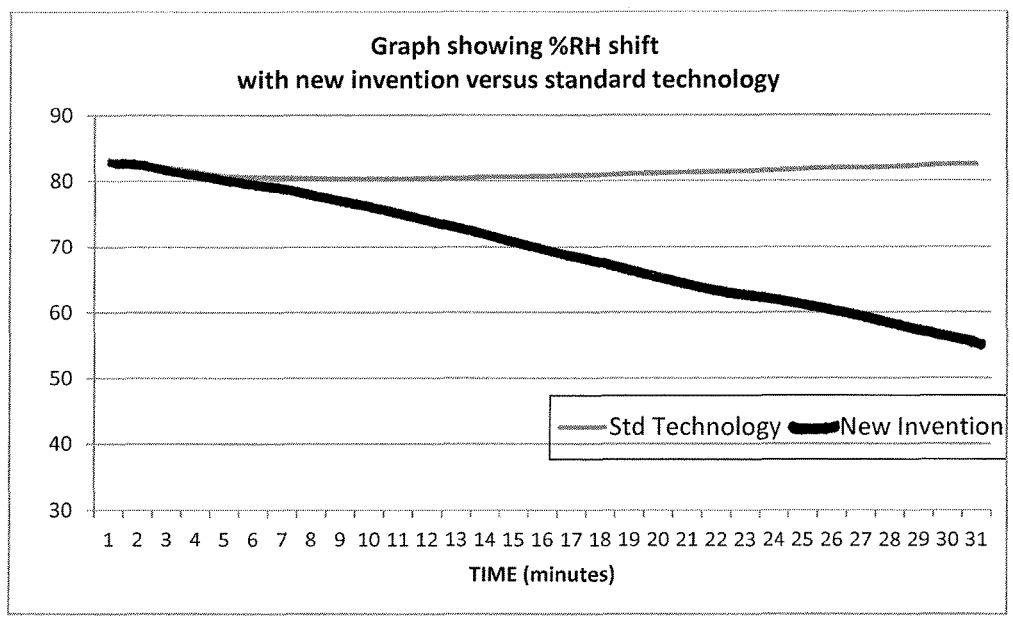
FIG. 6 is a comparison of the relative humidity shift when using a prior art cover with the cover according to the present invention, shown over a 30 minute time span.

FIG. 6 shows how a cover, manufactured according to the first embodiment of the present invention, allows the relative humidity to escape from under the cover. The cover enables the air to get to equilibrium faster, thereby reducing or eliminating the condensation under the cover. As shown in FIG. 6, the prior art (standard technology) cover maintains the relative humidity level over a 30 minute time span. In contract, the cover of the present invention drastically reduces the relative humidity over the same 30 minute time span.

The existing technology claims the cover materials are breathable based upon a measured moisture vapor transmission rate (MVTR) primarily attributed to the monolithic or micro-porous polyurethane coating applied to the cover material. This means a higher pressure under the cover must be attained and condensation must occur and be absorbed into the polyurethane layer before moisture will start to transfer through the cover. In the prior art, a wet system of moisture traps the humidity and creates a difference in pressure that leads to condensation and corrosion of equipment.

The impact of air permeability on relative humidity (shown in FIG. 6) was determined using a test chamber, which was developed to evaluate the technology. To keep the experiment simple, the temperature inside the test chamber was maintained at an equivalent temperature as outside the test fixture at 82+/−2 deg.F. Also, the % RH (relative humidity) outside the test fixture was measured at a constant 48% RH. The conditions in the test chamber are then developed (hot rod and water bath) to generate a constant RH of around 85+/−2% with the test sample sealed inside the chamber. The door to the chamber is then opened exposing the test sample to the outside environment. The test area is approximately 1 square foot of surface area and the size of the chamber is approximately 1.5 cubic feet. With the sealed door now open, the data is taken by measuring the change in relative humidity inside the chamber with a hygrometer. A test is taken every minute to help determine a rate of which the change in RH is occurring inside the chamber.

The management of relative humidity offered by the new invention is compelling and can be measured several ways. First, the chart shows the cover material of the new invention allowing relative humidity to pass through almost immediately. The curve of the chart shows the rate of RH change is relatively linear in terms of time. The chart shows approximately a 1% change in RH/minute/square foot. Over the same time period, zero change in RH has occurred with the current/existing technology. The next stage is to quantify the level of relative humidity or moist air passing through the new invention. It is known what the weight of dry air is at 0.075 lbs/ft$^3$. Using a psychometric chart we can calculate the weight of moisture in the chamber at 85% relative humidity and also at 50% relative humidity and thus extrapolate the rate in grains or grams of moisture being transferred through the new invention cover material.

It is known the weight of 1 cubic foot or air at 68 F at 65% RH is 0.075 lbs. Therefore, to measure the quantity or rate of moisture removed by the new cover material using the test chamber discussed, the following mathematical model is used. 1.5 cubic feet of chamber at 0.075×85% relative humidity. 1.5×0.075×133=14.96 grains of moisture in chamber. Comparatively 1.5×0.075×80=9.0 grains of moisture outside chamber. Thus 14.96−9.0=5.96 grains moisture removed in 30 minutes. Thus 6/30=moisture removal rate 0.2 grains moisture removed/minute. Thus actual cover material rate 0.2/1.5=0.12 grains of moisture/minute/cubic foot. Or multiply by 27=3.25 grains of moisture removed/minute/cubic yard.

Returning now to the construction of the protective cover according to a first embodiment of the invention, the inner textile layer 16 faces the object to be covered, and it is therefore preferable that the exposed surface 19 be smooth so as not to scratch covered equipment. This textile fabric layer 16 may be composed of woven, knit, and non-woven fabrics such as lightweight tricot warp knits of polyester or nylon. Such materials include Style 1158 manufactured by Hornwood and available from KTex of Wayne N.J., or Style #0862, a 100% semi-dull nylon 6,6 with 52 courses and 42 wales and a weight of 0.9 oz./sq. yd., available from Somerset Industries of Gloversville, N.Y. Also suitable are non-woven spunbond nylon fabrics such as Cerex Advanced Fabrics Orion style #70 having a weight of 0.7 oz./sq. yd. and a thickness of 6-7 mil.

Another suitable fabric is yellow Nexus® nonwoven polyester having a weight of 1-1.2 oz./yd$^2$, and a thickness of 0.008-0.012 in., also available from Precision Fabrics Group. The inner layer may also be hydrophilic, either by treatment or choice of fibers and construction, helping to wick moisture away from the covered object and to spread the moisture laterally, facilitating the vapor transmission through the cover to the outside. The inner layer may also be rendered electrically conductive by either weaving in of inherently conductive fibers or by topical (i.e. coating, printing, etc.) treatment.

Figure 2:
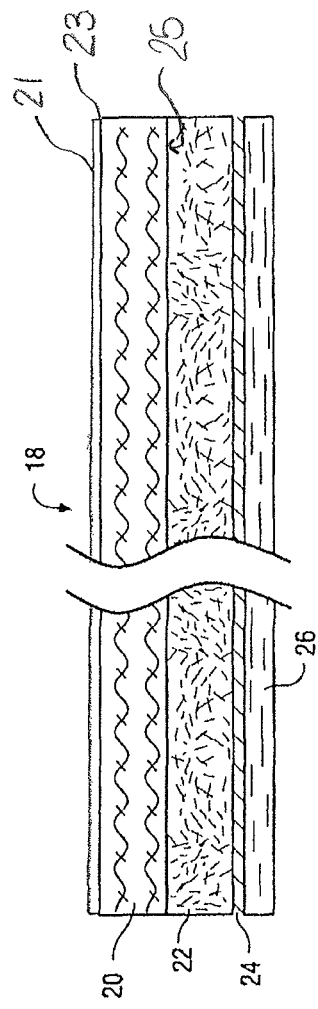
FIG. 2 is a cross section similar to FIG. 1 but with an additional textile layer interposed between the inner and outer layers.

Referring now to FIG. 2, a second embodiment illustrates a cover 18 that includes an outer textile or face layer 20 similar to face layer 12, overlying an interior textile fabric layer 22 incorporating super-absorbent polymers (SAPS). The textile fabric layer 22 is preferably a suitable nonwoven fabric enclosing the SAP's in an otherwise conventional fashion. The layer 22 in turn overlies an ePTFE film or membrane 24 similar to membrane 14 described in connection with FIG. 1. The inner layer 26 is a textile fabric that may be of a material similar to inner textile layer 16 described hereinabove. Use of SAPs in the intermediate fabric layer 22 minimizes the possibility of reabsorption of moisture back into the space below the cover.

FIG. 3 illustrates a variation of the embodiment shown in FIG. 1. As such, the outer textile or face layer 28, intermediate membrane 30 and inner textile layer 32 are similar to the corresponding layers 12, 14 and 16 described hereinabove in connection with FIG. 1. Here, however, the cover 26 also includes a plurality of silicone (or other suitable material) spacers or dots 34 applied to the exposed face 36 of the inner layer 32. The "dots" 34 may be applied in any random or patterned configuration and serve to maintain a space between (or at least minimize contact between) the object to be covered and the inner textile layer 32.

With the above configurations, the laminated protective cover allows moisture to be expelled readily from the interior covered area through the laminated cover itself to the outside environment. In this regard, the cover fabric and cover itself preferably have an MVTR of at least 4000 to about 8000 g/m²/day and as high as 14000 g/m²/day or more, per ISO 15496 (inverted cup method). The cover thus provides environmental protection and resistance to penetration of water, wind and sand. The cover may be especially useful in the prevention of corrosion during transportation of military vehicles or other equipment, and protection from contamination by chemical and biological warfare agents.

In the specific comparative example below, an ePTFE laminate cover in accordance with the invention is constructed of three layers including: (a) Nylon 6, 6 Ripstop face fabric available from Mitsui Textiles, Japan; (b) ePTFE membrane; and (c) Nexus® polyester spunlace, 30 g/m2, available from Precision Fabrics Group. The ePTFE laminate is available from BHA Technologies, Inc. under the name eV5004-3 L.

In one example, the following commonly used protective cover materials were compared against the above ePTFE laminate: (1) Herculite® 90 Coated Cover Fabric available from Manart-Hirsch Co., Inc., NY; (2) Sunbrella® Marine Canvas Cover Fabric available from Great Lakes Fabrics Inc., MI as their product number 4630; and (3) Polyethylene shrink wrap (Marine Boat cover) available from Shrinkwrap International Inc., MI Mild Steel corrosion coupons were obtained from Metal Samples Company, AL. Each coupon was 2"×1"×1/16" in dimension. Ten such coupons were wrapped in each of the four cover materials and left in an open parking lot for a period of two weeks. At the end of two weeks, the condition of the coupons was evaluated for signs of rusting. They were graded on a scale of 1 to 5, with 1 indicating that none of the ten coupons were visually rusted and 5 indicating that all ten coupons were visually rusted.

The results from this evaluation are given in the table below. Also listed is the moisture vapor transmission rate of each of the four laminates.

TABLE 1

| COVER MATERIAL | Corrosion Rating (average of ten repeats) | MVTR (ISO 15496, inverted cup) |
|---|---|---|
| Herculite ® 90 | 4.8 | 0 |
| Sunbrella ® Marine Canvas | 2.6 | 6,900 g/m²/day |
| Polyethylene shrink wrap (Marine Boat cover) | 4.2 | 0 |
| ePTFE laminate (eV5004-3L) | 1.1 | 14,000 g/m²/day |

It is also within the scope of this invention to add a layer of air (gas) permeable insulation such as Primaloft® within the laminate 10, specifically under the membrane, to retain heat under the cover. In addition, a metal (e.g. aluminum) reflective coating may be applied to the exposed inner face of the inner layer for reflecting heat and/or for its electrostatic dissipative properties.

Another variation includes the addition of a durable water repellant coating to the individual fibers that are used to make up the exposed face of the outer textile layer. Since this is not a continuous coating "on" the outer surface of the exposed face, such a water repellant coating results in little to no impact on air permeability of the entire cover material.

In the preferred embodiment of the present invention, the outer textile cover layer (12, 20 or 28) includes a further level of durability that increases the resistance to abrasion and wear from environmental factors such as wind, sand, and other debris as well as increased resistance to environmental conditions including exposure to solar radiation (UV rays), temperature and humidity as well as fire resistance. This further level of durability can be implemented in the following embodiments. Each of the following embodiments may be implemented alone or in combination to increase the durability and reduce the degradation of the protective cover (10, 18 or 26).

In a first embodiment, a top coating (13, 21 or 29) can be applied to an upper surface (15, 23 or 31) of the outer layer (12, 20 or 28). The top coating (13, 21 or 29) provides increased durability and UV resistance. The top coating (13, 21 or 29) may be laminated or otherwise applied to the upper surface (15, 23 or 31) of the outer layer (12, 20 or 28). The top coating (13, 21 or 29) typically includes a ceramic material. The top coating (13, 21 or 29) is preferably perforated or needle punched to provide small holes that allow for the protective cover (10, 18 or 26) to "breathe" and continue to provide air permeability. The top coating is preferably a ceramic or nano-ceramic surface UV stabilizer coating applied to the outer (upper) surface (15, 23 or 31) of the outer layer (12, 20, or 28) of the fabric system to increase the cover's resistance to UV light to greater than two times the functional life of the cover (greater than 4 years) and minimize loss in relative humidity and airflow movement through the fabric system.

Simulation testing for UV stability can be done in a laboratory environment using a Xenon Arc exposure that closely simulates the wavelengths found in sunlight (short wavelengths around 280-320 nm). Under test conditions as stated in ASTM D-154, 1000 hours of exposure can simulate 24 months of direct sunlight exposure. Current materials have shown to have less than 30% of their original strength after 1000 hours, while the ceramic top coating of this embodiment of the present invention shows greater than 75% retained strength after 1000 hours of exposure.

In another embodiment, the top coating (13, 21 or 29) applied to the upper surface (15, 23 or 31) of the outer layer (12, 20 or 28) may be applied as a gas plasma coating. The finishing process may further include the application of a curable coating including metal or metal oxide pigments, fire resistant components and/or UV-absorbing components.

The top coating (13, 21 or 29) can be formulated from a variety of polymer systems including curable acrylic polymers, polyurethanes, silicon polymer systems, polyesters, polyamides, or other polymers that can be cured by exposure to ultraviolet light, heat, or polymerization catalysts. The top coating composition can include a variety of metals and metal oxides, such as boron, boron oxides, calcium oxides, iron oxides, lithium salts, titanium dioxide, carbon nanotubes, ultrafine carbon particles, carbon, silicon dioxide, ceramics, all patent class C materials, microscopic glass beads such as Aerogel, and the like. Preferred materials are highly reflective to incident UV radiation or opaque to UV radiation.

In yet another embodiment, a top coating (13, 21 or 29) can be applied to an upper surface (15, 23 or 31) of the outer layer (12, 20 or 28) using an airfoam technique. An airfoam finishing coating technique, such as EvoTop™, made by DyStar, Inc., is applied to the upper surface (15, 23 or 31) of the outer layer (12, 20 or 28) of the protective cover (10, 18 or 26). The coating includes ceramic and/or other protective elements as described above. Other means of coating the fabric using similar materials with similar compositions are contemplated and within the scope of the current invention. The application of the coating 13, 21 or 29 via an airfoam technique leaves small openings that allow the coating to "breathe" without the need to perform the additional step of needle punching.

In a further embodiment, a technique can be used that coats each individual fiber used to construct the outer layer 12a as shown in FIG. 4. In this embodiment, there is not an actual coating layer 13, 21 or 29 but rather, in this process, each individual fiber 42 that makes up the fabric material of the outer layer (12, 20 or 28) of the protective cover 10, 18 or 26 is coated, possibly with ceramic or another protective material or element, prior to constructing (weaving or knitting) the fabric material.

This process may be accomplished by making a yarn or thread that can be used to make fabrics that have the desired durability and resistance to sunlight and ultraviolet radiation by first coating and curing one yarn bundle, then wrapping the coated yarn bundle in another layer of yarn(s) to minimize the surface abrasion that may be present on the coated yarn and to then weave the multi-layer yarn into a fabric.

In a further embodiment, when using a material that includes fibers that are extruded, a ceramic or other type of coating can be applied directly to the fibers during the fiber extrusion process (coextruding the coating onto the fiber).

In this embodiment, the fabric for the outer layer may be constructed by spinning a bicomponent yarn or thread, which is a yarn with two distinct material regions, where the outer yarn layer is spun from a polymer that has been compounded with fine particulates that can protect the inner fiber component from UV exposure. Very fine particles, especially particles that are finer than 2 microns in diameter, and even more preferably particles that have a mean diameter of 0.5 microns or less are preferred. The bicomponent fibers can be melt spun or solution spun using techniques that are known to those skilled in the art of fiber spinning. The bicomponent fibers can then be made into yarns that have excellent stability to sunlight and UV exposures and mechanical abrasion, but which are less abrasive themselves than the yarns or fabrics made by the coating processes.

Polymers that are useful for such bicomponent fibers can include polyamides, polyester, acrylic polymers, aramids, and other polymers known to make strong durable fibers. Materials that are useful for the layer containing particulates include metals, metal oxides, carbon, carbon nanotubes, opaque glassy materials, microscopic glass beads, and the like.

In yet another embodiment, carbon nanotubes can be either incorporated into the outer layer (12, 20 or 28) of the protective cover (10, 18 or 26), as described above, or carbon nanotube fibers can be used to actually construct the outer textile cover layer 12, 20 or 28.

Each of the embodiments described above are used in conjunction with a multi-layer cover to provide improved cover durability including resistance to wear and abrasion and resistance to environmental conditions including solar radiation, temperature and humidity. The outer layer (12, 20 or 28) material generally includes a fabric outer layer composed of high strength yarns made from polymer such as nylon, polyester or aramid. In addition to the outer layer, the composite includes a "breathable" middle or intermediate inner layer (14, 22 or 30). This intermediate layer is preferably a polymeric membrane that permits high levels of moisture vapor transport. The breathable middle layer can be composed of such materials as expanded polytetrafluoroethylene, microporous polyurethane, or other materials that provide both moisture vapor transport and resistance to the penetration of liquid water, acids, bases, oils, greases and salt spray. The multi-layer cover also includes a lightweight, flexible fabric inner layer (16, 26 or 32). The inner surface layer may be made from open mesh tricot knits made of polyester or similar fabric, which provides support for the middle layer during lamination and which provides a flexible substrate for the entire cover that has minimal resistance to air or moisture transport.

In each of these various embodiments, a fire retardant application can also be included either as an additional coating or added to the various top level coatings (13, 21 or 29) or as part of one of the other layers of the cover. In certain cover applications there is the potential that the cover may become exposed to a combustible environment, where there is a risk that the cover may support combustion and result in a dangerous environment for the equipment being protected or the persons operating/maintaining/guarding the equipment.

In order to enable the cover to have a fire retardant quality, any materials used (such as nylon and polyester), which support combustion, can be treated with a flame retardant topical treatment (such as available from Alexium Inc.) or conversely the cover can be made with materials that are inherently non-combustible, such as aramid, mod-acrylic or other non-combustible materials. When creating a fire-resistant material it is critical that the material still remains air permeable, lightweight and still fire-resistant.

Prior art covers would coat the material (nylon or polyester) of the cover with a bromide and phosphate coating, which does not allow for air permeability. In a preferred embodiment of the present invention, the cover is treated with a FR (fire retardant) compound such as that compound manufactured by Alexium Inc. and provided by the Duro Company of Fall River, Mass., which prevents oxygen from getting into the nylon, thereby preventing the nylon from burning. When the material of the cover is treated with this compound, the material will melt, but not burn due to the treatment and the bonding technique. Meanwhile, the treated fabric remains breathable.

The Alexium brand product is unique in that is utilizes Reactive Surface Treatment (RST), utilizing microwave energy to direct a precursor's polymerization onto the substrate's (fabric's) surface. It then uses a gas plasma to introduce minute quantities of the chemical to be permanently bonded to the fabric, providing unique new fire retardant functions to the fabric without adversely impacting the fabric's inherent properties such as MVTR, Air permeability or overall weight. The Fire retardant chemistry is a new nano non-halogenated formulation that gives the fabric the desired self-extinguishing, no drip and no melt properties.

Additionally, carbon fibers, bundles or yarns may be used in the protective cover (10, 18 or 26), which provides static dissipative or electrostatic discharge (ESD) or anti-static characteristics. Many objects that are protected by covers need ESD protection, which is not provided by prior art covers. There is the potential that the cover may become exposed to a build up of static electricity, which creates a risk that the cover will support an electrical charge and result in a dangerous environment for the equipment being protected (electronic or software, etc.) and the persons operating the equipment. Therefore, it is preferred that the cover exhibit electro-static dissipating properties. The electro-static dissipating ESD component applied to the multi-layer fabric is generally and typically configured to give an object made with the multi-layer fabric system, such as an enhanced performing protective cover, an electro-static decay performance of less than 0.5 seconds for 5000 volts measured at both a top and bottom portion of said enhanced performing protective cover.

An additional feature of another embodiment of the invention is therefore to impart a cost effective and durable electrical conductive or electro-static dissipative (ESD) performance to the fabric material using a screen printing technology of an electrically conductive ink. The print lay-down of ink is critical to conductivity performance and in the case of the overall concept of the present invention, preventing loss of air permeability of the cover.

In a preferred embodiment of the present invention, a lower surface (17, 25, 33) of the outer layer (12, 20 or 28) of the fabric material is treated with a printed carbon treatment or conversely can be made with a fabric material that is produced with ESD yarns or fibers. When the lower surface (17, 25, 33 or 35) of the outer layer (12, 20 or 28) is treated with carbon material. The surface can be entirely treated or more preferably, partially treated, such as with a pattern. The placement of the carbon on the lower surface (17, 25 or 33) of the outer layer (12, 20 or 28) is superior to the prior art usage of carbon on an upper surface of the outer layer of the cover, because the carbon on the upper surface is subject to breakage and degradation due to UV solar breakdown.

To ensure protection of the conductive print and long term function, the print is applied ONLY to the inside of the cover fabric laminate. Because the print/ink is a water based polyurethane compound with a durable carbon particle component, when the ink is applied to the fabric, there is no significant loss in air permeability. If the print is applied to the ePTFE. The very small pore sizes (0.03 microns) are filled with the ink, blocking substantial but not all air flow. When the carbon print is applied to the inside of the woven nylon face fabric, the print adheres to the large yarn fibers and as a result in the woven fabric blocks very little air flow. Openings in the face fabric are order of magnitude 500× larger. Thus with the membrane part of the cover controlling the overall air permeability of the laminate the ink must be printed on the fabric and not the membrane. Effective coverage to attain to meet static dissipation requirements is based upon the level of carbon in the ink and the surface area printed on to the fabric. Trials done to date that provide optimum discharge used a 15-20% print lay down in a diamond shape pattern with approximately 1.5-2.0 mm lines over a 1.0-1.5 square centimeter area.

One compelling aspect of this feature of the invention is that even though the printed ink is located on the inside of the laminate, the porous nature of the various cover materials and laminate layers used allow volume electrical conductivity through the fabric/layers and thus allow static dissipation through the fabric. Static dissipation or static decay test method Federal Standard 191A and 4046 and NFPA-99 challenges the conductive material to provide decay of 5000 volts in less than 0.5 seconds usually less than 0.1 seconds.

Further testing has shown that the ESD printing on the inside of the cover laminate does not significantly impact air permeability performance of the membrane and thus does not impact or reduce the level of relative humidity transported through the laminate. A cover material manufactured with the fabric of the invention with ESD printing as described by this feature of the invention can still maintain greater than 1% relative humidity transfer/square foot of surface area/per minute.

It is contemplated and within the scope of the present invention that each of the additional levels of durability described above can be used individually or in combination with one another. Each of these embodiments can also be used in conjunction with each of the previously described covers, including but not limited to, the use of super-absorbent polymers, a plurality of silicone spacers or dots 34, as well as the use of various fabric combinations previously disclosed.

Some of the applications for these laminate fabrics are protective covers that are particularly useful in situations where there is need for protection against dust, sand, rain, microbes and UV light exposure, while minimizing corrosion. For example: (a) Protective covers for military and civilian helicopters and other aircraft; (b) Protective covers for military ground vehicles; (c) Protective covers for ground aviation equipment; (d) Protective covers for shipboard equipment; (e) Boat covers; (f) Vehicle covers (e.g., motorcycles, automobiles, etc.); (g) Military Tank hatch covers; and (h) Personal arms protective covers.

Other possible uses for the fabric of the invention include, but are not limited to, industrial personal protective equipment/clothing with or without ESD protection; petrochemical applications including both outer shells (the heavy insulated long coat that is worn while actively performing tasks in harsh weather (off shore oil rigs for example)) and station ware (the layers worn under the outer shell and is worn when performing interior tasks.) The presently disclosed fabric may provide electric arc (ESD) protective gear for both outer shells and station ware.

The fabric of the present invention may be used to fabricate emergency response clothing such as, but not limited to, firefighting clothing (multiple layers) and turnout gear (the outer ware/heavy exterior long "fire coat" that is worn while actively fighting a fire); technical rescue gear and clothing, which is intended to include outer wear (coats and pants) that are typically fire resistant, static resistant, highly breathable, and liquid resistant (body fluids).

The fabric of the present invention may be utilized to provide emergency medical services gear and clothing as well as military soldier gear and clothing including uniforms, combat shirts and trousers; flight suits and flight uniforms, as well as military and nonmilitary refueling gear including exterior coats and pants worn by maintenance crews when refueling and aircraft and munitions handling and assembly gear and clothing including outer shells, coats and pants worn when handling munitions (to assure that they will be no static discharge and to provide fire resistant clothing) as well as wet weather gear; bivouac bags (sleeping system); chemically active textile suits and related applications; tent and shelter fabrics/systems; medical clothing and related products including lab coats, uniforms, and trauma suits; as well as mattress fabrics/components/covers.

Figure 5:
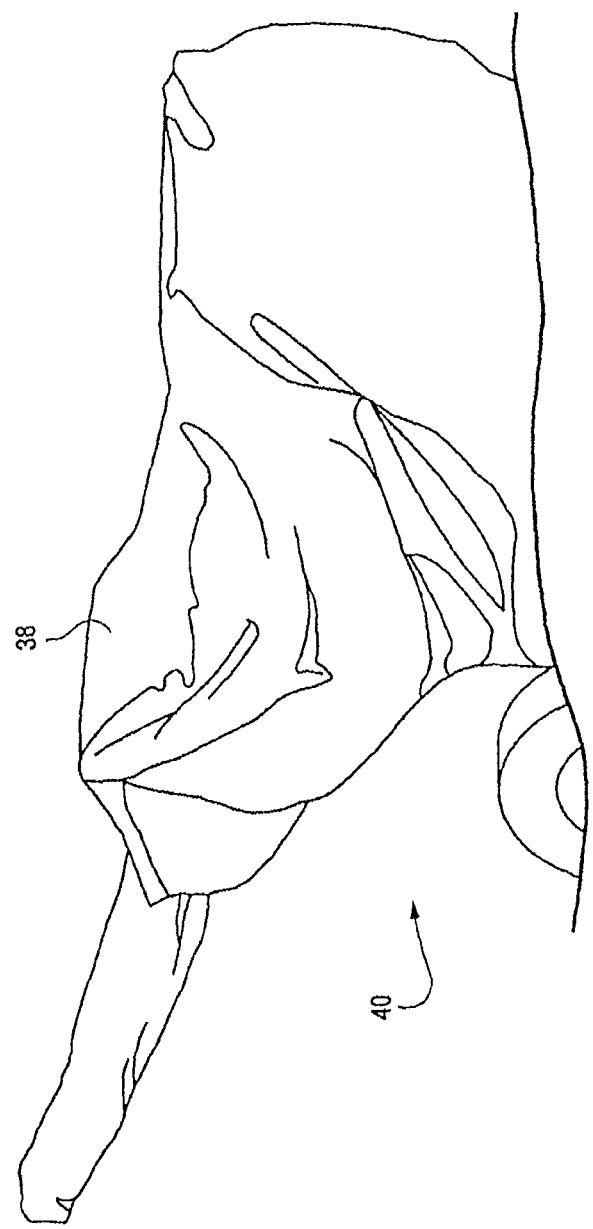
FIG. 5 is a partial perspective view of a protective cover in accordance with the invention applied over a military weapon.

FIG. 5 illustrates one of many applications for the protective covers as described herein. Specifically, a cover 38 is shown in place, covering a military weapon 40.

Composite fabric systems within the scope of the present invention could include additional layers, selected to provide specific new attributes to the system and within the composite. Such systems might include one or more layers to reduce sound transmission. Another would be to include a metal or metallized film layer that would reflect heat or dissipates static or provide EMI shielding. Another type of layer that could be included might include materials designed to absorb particular parts of the electromagnetic spectrum, such as infrared radiation to reduce IR signal or detection, radio signals or other means of detection. Yet another type of layer could be included to degrade biological or chemical toxins.

Providing additional insulation value is another example of a particularly useful additional composite layer. A preferred composite layer for retaining heat while maintaining composite moisture vapor transport would be to include a gas permeable insulating layer such as Primaloft® under the permeable membrane layer. Such a system would enable maintaining a warm environment within a shelter or cover while allowing moisture to escape.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims. Modifications and substitutions by one of ordinary skill in the art are considered to be within the scope of the present invention which is not to be limited except by the allowed claims and their legal equivalents.

The invention claimed is:

1. A multi-layer fabric, said multi-layer fabric comprising:
an outer layer having an exterior facing surface and an interior facing surface, wherein said exterior facing surface is treated with a ceramic based UV stabilizer coating; and
an electro-static dissipating (ESD) component and a flame retardant component applied to one or more layers of said multi-layer fabric, said one or more layers of said multi-layer fabric treated with said ceramic based UV stabilizer coating, said electro-static dissipating (ESD) component and a flame retardant component cooperating to provide a relative humidity transmittance rate through the treated multi-layer fabric system at or greater than 0.2%/minute/cu.ft. or 0.05 grains of moisture/minute/cu.ft.

2. The multi-layer fabric of claim 1 wherein said multi-layer fabric is a three layer structure comprised of an oleo-phobic and hydrophobic treated woven or nonwoven outer layer including said exterior facing surface treated with a ceramic based UV stabilizer coating, a micro-porous film as a second or middle layer and a oleo-phobic or hydrophobic woven, nonwoven or knit third/inner layer.

3. The multi-layer fabric of claim 2 wherein the outer layer and the inner layer are adhesively bonded or laminated to either side of the middle film layer.

4. The multi-layer fabric of claim 1 wherein the ceramic surface UV stabilizer coating is a porous foam ceramic coating applied to the exterior facing surface of the outer layer of the multi-layer fabric.

5. The multi-layer fabric system of claim 1 wherein said electro-static dissipating ESD component comprises electrostatic dissipating carbon ink printed on at least a portion of said interior facing surface of the outer layer of said multi-layer fabric.

6. The multi-layer fabric of claim 2, wherein the ESD component is provided using 1 to 100% carbon based or metallic based yarns or threads woven or knitted in at least one of the outer or inner layers of the multi-layer fabric system.

7. The multi-layer fabric of claim 2, wherein the ESD component is provided using a 1 to 100% carbon based or metallic based compound or fibril component mixed into the micro-porous middle layer of the multi-layer fabric system.

8. The multi-layer fabric of claim 1 wherein the flame retardant component is provided either from fire retardant treatments applied to individual layers or from fire retardant treatments applied to the assembled multi-layer fabric system by means of wet impregnation, dip treatment or by means of plasma fire retardant and microwave or a polymer deposition process.

9. The multi-layer fabric of claim 1 wherein the micro-porous middle film layer is selected from the group of film materials consisting of polyethylene, polyurethane and ePTFE (expanded polytetrafluoroethylene) materials.

10. The multi-layer fabric of claim 2, wherein said outer and said inner layers are textile fabric layers.

11. A covering for an object fabricated from the multi-layer fabric of claim 1.

12. A garment fabricated from the multi-layer fabric of claim 1.

13. A multi-layer fabric comprising:
an outer layer having an upper surface and a lower surface, wherein said lower surface of said outer layer is printed with a carbon containing material in at least a pattern, and wherein said upper surface includes a ceramic based UV stabilizer material, and wherein at least said upper surface of said outer layer is treated with a flame retardant treatment;
an inner textile layer; and
at least one air permeable and moisture-vapor transmissive intermediate layer, the at least one intermediate layer located between the outer layer and the inner textile layer, wherein each of said outer layer treated with said ceramic based UV stabilizer and said flame retardant treatment, and inner and intermediate layers are air permeable and moisture-vapor transmissive, and wherein said multi-layer fabric provides a relative humidity transmittance rate through the multi-layer fabric system at or greater than 0.20%/minute/cu.ft. or 0.05 grains of moisture/minute/cu.ft.

14. A covering for an object fabricated from the multi-layer fabric of claim 13.

15. A garment fabricated from the multi-layer fabric of claim 13.

16. A multi-layer fabric comprising:
an outer layer with an upper surface and a lower surface, wherein said outer layer is air permeable and moisture-vapor transmissive and wherein said lower surface of said outer layer is printed with a carbon containing material in at least a pattern, and wherein said upper surface of said outer layer is treated with a flame retardant topical treatment;
an inner textile layer; and
at least one air permeable and moisture-vapor transmissive intermediate layer, the at least one intermediate layer located between the outer layer and the inner textile layer, wherein said outer layer treated with a flame retardant topical treatment, said inner textile layer and said at least one air permeable and moisture-vapor transmissive intermediate layer cooperate to provide a moisture vapor transmissive multi-layer fabric system.

17. A covering for an object fabricated from the multi-layer fabric of claim 16.

18. A garment fabricated from the multi-layer fabric of claim 16.

* * * * *